AVALANCHE TRANSISTOR HAVING REDUCED WIDTH IN DEPLETION REGION ADJACENT GATE SURFACE

Filed April 25, 1967

INVENTOR
TAKAYUKI YANAGAWA
BY
Hopgood & Calimafde
ATTORNEYS

INVENTOR
TAKAYUKI YANAGAWA
BY
Hopgood & Calimafde
ATTORNEYS

United States Patent Office 3,444,442

Patented May 13, 1969

3,444,442

AVALANCHE TRANSISTOR HAVING REDUCED WIDTH IN DEPLETION REGION ADJACENT GATE SURFACE

Takayuki Yanagawa, Tokyo, Japan, assignor to Nippon Electric Company, Limited, Tokyo, Japan, a corporation of Japan Filed Apr. 25, 1967, Ser. No. 633,526
Claims priority, application Japan, Apr. 27, 1966, 41/26,810
Int. Cl. H01l *11/14*
U.S. Cl. 317—235 5 Claims

ABSTRACT OF THE DISCLOSURE

A surface controlled avalanche transistor (SCAT) in which the width of the depletion layer of the portion of the p-n junction nearest to the gate electrode is made narrower than the portion of the depletion layer which is more remote from the gate electrode.

*Background of the invention*

The surface controlled avalanche transistor (referred to hereinafter as SCAT) has been known as a type of semiconductor device to perform amplification of electrical signals. The SCAT is a semiconductor device comprising a p-n junction capable of producing the phenomenon of avalanche breakdown by the application of reverse bias voltage across the p-n junction. The structure includes a semiconductor crystal with a p-n junction, an insulating film on the crystal and a metallic gate electrode interposed on the insulating film on a portion of the semiconductor crystal surface at which an end of the p-n junction is exposed. Such a SCAT structure provides power amplification. The voltage at which avalanche breakdown begins to occur at the p-n junction can be controlled by the voltage applied to the gate electrode.

These facts were reported for the first time by W. Shockley and W. W. Hooper in a treatise entitled "The Surface Controlled Avalanche Transistor" published in the "1964 Western Electronic Show and Convention Technical Report" vol. 3, No. 12.1. In this treatise, there is suggested the possibility of the SCAT device operating in the super-high frequency range of the order of 10 gigacycles. Thus the promising capabilities of this device as an amplifying element for use in the super-high frequency range were recognized, however, further teaching as to how to achieve this was not set forth.

It has been a well established fact that in order to achieve a p-n junction capable of producing avalanche breakdown it is necessary that the impurity concentration of either the p- or n-type region be lower than a predetermined value, as those skilled in the art are aware. The same precaution must be observed in the design of all embodiments of this invention to be described.

The conventional SCAT structure has a p-n junction capable of producing avalanche breakdown uniformly over the entire p-n junction plane. With such structures, an electric field applied to the p-n junction from the gate electrode through an insulating layer could penetrate only that portion of the depletion layer beneath the gate electrode which is relatively close to the electrode and the control of avalanche breakdown at a deeper or an inner junction region due to the application of the gate voltage was not efficacious.

*Objects of the invention*

It is a principal object of this invention to provide an improved SCAT structure which improves the controllability of avalanche breakdown by means of gate voltage control.

All of the objects, features and advantages of this invention and the manner of attaining them will become more apparent and the invention itself will be best understood by reference to the following description of the invention taken in conjunction with the accompanying drawing.

*General summary of the invention*

An outstanding feature of the SCAT device according to this invention comprises a modification of known SCAT structures in that the width of the depletion layer of that portion of a p-n junction which resides near the gate electrode is made narrower or thinner than that of the depletion layer of the portion of p-n junction more remote from the gate electrode.

This variation in width of the depletion layer of the p-n junction may be accomplished in any one of several ways. One method is to perform doping in such a manner that the impurity concentration of either or both of the p and n-type region portions close to the gate electrode becomes higher than that of the remaining portions. Another method is to perform doping in such a manner that the impurity concentration gradient in the depletion layer in the direction normal to the p-n junction becomes less steep at progressively greater distances of the p-n junction from the gate electrode.

With the surface controlled avalanche transistor having such a structure, the avalanche breakdown voltage of that portion of the p-n junction just beneath and in the vicinity of the gate electrode, becomes appreciably lower than that of the remaining portion of the p-n junction. Consequently, the SCAT device according to this invention can effectively control the avalanche breakdown voltage level by the application of the gate voltage.

*Detailed description*

Figures 1, 2, 3, 4, 5, 6A:
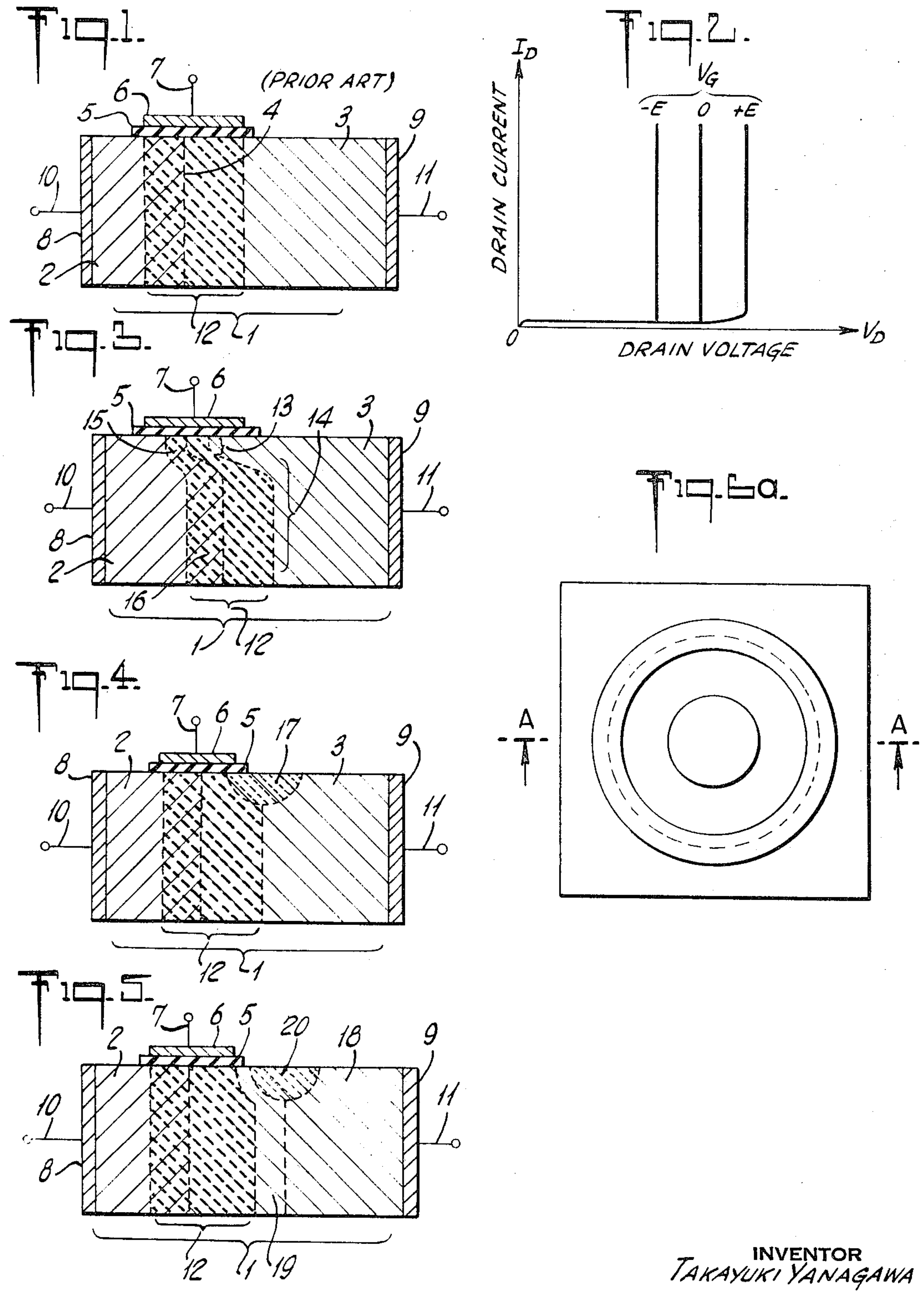
FIG. 1 is a cross-sectional view of a conventional semiconductor device to which the principles of this invention can be applied.
FIG. 2 is a graph showing typical characteristics of the conventional semiconductor device of FIG. 1.
FIGS. 3, 4, and 5 are cross-sectional views of first, second and third embodiments of semiconductor devices of the general type illustrated in FIG. 1 which have been modified in accordance with the principles of this invention.
FIG. 6*a* is a plan view of a fourth embodiment of a semiconductor device according to this invention.

FIG. 1 is a schematic representation of a conventional SCAT structure which consists essentially of a single crystal semiconductor 1 with two adjacent regions 2 and 3 of opposite conductivity types, for example p and n type, respectively. There is also provided a boundary plane or a p-n junction 4, a thin insulating film 5 covering a part of the surface portion of the semiconductor crystal at which the edge of the p-n junction 4 is exposed, and a metallic gate electrode 6 on the insulating film 5. Metallic electrodes 8 and 9 are attached respectively to the regions 2 and 3 with non-rectifying contacts, and lead wires 7, 10, and 11 are connected respectively to the electrodes 6, 8, and 9. With such a construction, avalanche breakdown will occur at the p-n junction 4, provided the impurity concentrations of these regions have been suitably predetermined and a reverse bias of sufficient magnitude is applied across the terminals 10 and 11. With an increase in the positive voltage applied to the electrode 9 with the electrode 8 grounded, the width of the depletion layer 12 formed on both sides of the p-n junction 4 will expand gradually. Because the potential gradient across electrodes 8 and 9 is directed substantially to the depletion layer 12, a rather steep potential gradient or a strong electric field will be produced in this layer. When the applied voltage reaches a certain critical value and the intensity of the electric field in the depletion layer 12 becomes sufficiently strong, avalanche breakdown occurs at the p-n junction 4. This critical voltage value is called the avalanche breakdown voltage.

By applying a suitable voltage across either the electrodes 6 and 8 or the electrodes 6 and 9, the intensity of the electric field in the depletion layer 12 can be controlled and the avalanche breakdown voltage changed accordingly. Such a SCAT device is analogous, both in its geometry and in its behavior, to an insulated gate field effect transistor. Based on the structural analogy, the electrodes 6, 8, and 9 of FIG. 1 are also designated gate, source, and drain electrodes, respectively.

FIG. 2 depicts the manner in which drain current $I_D$ changes as a function of drain voltage $V_D$ when the gate voltage $V_G$ as a parameter is applied as a minus, zero, and positive value with the source electrode 8 grounded. It is evident from the drain current family of curves shown in FIG. 2 that both the drain voltage and the drain current could be controlled by the gate voltage.

Now, the conventional SCAT shown in FIG. 1 was so fabricated that avalanche breakdown would occur uniformly over the entire plane of the p-n junction 4. However, the electric field effectively applied to the depletion layer 12 from the gate electrode 6 through the insulating layer 12 is limited to only the portion of the depletion layer just beneath the gate electrode. 6. That is, the avalanche breakdown voltage at the portion of the p-n junction remote from the gate electrode 6 was beyond the control of the gate voltage. Moreover, one could not rely upon having a uniform avalanche breakdown voltage over the entire p-n junction plane, i.e., breakdown could occur at different voltage values. This was due to the presence of heterogeneous regions in or near the junction plane, or the presence of locally intensified electric fields due to the radii of curvature possessed by the p-n junction, because the avalanche breakdown voltage level at such locations was invariably lower than at other locations. Accordingly, at locations at or near the part of the p-n junction beyond the influence of the electric field in the known SCAT structure, the control of drain voltage and current by application of the gate voltage became markedly inefficacious. This disadvantage can be substantially eliminated by the improved SCAT structures according to this invention.

FIGS. 3, 4, and 5 each illustrates a SCAT structure embodying the present invention wherein like parts or regions are denoted by the same numerals as in FIG. 1.

FIG. 3 illustrates an example of a SCAT structure so fabricated that the impurity concentration gradient in the direction normal to the p-n junction has been changed along the p-n junction. In other words, the gradient at the p-n junction portion 13 close to the semiconductor surface beneath the gate electrode 6 has been made steeper than that at the remaining portion 14 of the p-n junction so that avalanche breakdown can be produced exclusively at the portion 13.

To illustrate this more clearly, the ratio of the width of the depletion layer 16 at the p-n junction portion 14 to that of the width of the depletion layer 15 at the junction portion 13, is depicted in exaggerated form in FIG. 3 as compared with actual ratios. Also, the location of the p-n junction portion 14 has been drawn intentionally as being shifted from that of the portion 13. This has been done simply for ease of visualizing the transition from the portion 13 to the portion 14. The p-n junction may be planar or it may have some three-dimensional geometry, as illustrated, provided the gradient at the portion 13 of the p-n junction close to the gate electrode has been made steeper than that of the remaining portion 14.

The SCAT structure illustrated in FIG. 3 can be fabricated easily by the well-known diffusion technique. For example, it can be manufactured by forming a p-n junction by twice diffusing a p-type impurity material from the surface of the n-type semiconductor 3 on which the electrode 8 is to be installed, in such a manner either that the surface concentration of a p-type diffusant to be diffused into region 13 is made different from that to be diffused into region 14, or that the diffusion depth of the p-type diffusant between regions 13 and 14 is varied by controlling the diffusion time interval.

FIG. 4 is a SCAT structure according to another embodiment of the present invention, in which the impurity concentration of the n-type region has been changed along the p-n junction. Such an n-type region 17 of high concentration is formed in a semiconductor crystal in the vicinity of the p-n junction plane by diffusing an n-type impurity material to impart a surface concentration higher than the impurity concentration of the n-type semiconductor 3 per se to the region 17 from the surface of the n-type semiconductor 3 on which the gate electrode 6 is to be formed. As a result, occurrence of avalanche breakdown is restricted to the surface portion of the p-n junction close to the gate electrode 6. The high concentration region 17 can be formed by the well-known selective diffusion or impurity doping technique. It will be apparent that a p-type impurity material of high concentration may be doped into the top surface of the p-type region 2 in lieu of the region 17, to obtain the equivalent effect.

FIG. 5 shows still another embodiment of the present invention as a modification of the structure of FIG. 4. In the device of FIG. 5, the n-type region 3 of FIG. 4 has been replaced by a combination of an n-type low resistivity substrate region 18 and a comparatively high resistivity n-type region 19 epitaxially grown thereon. An n-type impurity material of high concentration is preliminarily doped into a restricted portion 20 of the surface of the n-type semiconductor crystal substrate 18 on which the gate electrode 6 is to be installed. The impurity of this high impurity region 20 diffuses into the n-type layer 19 while this latter layer 19 is being epitaxially grown on the substrate 18 at a high temperature. A p-type impurity material is then diffused into the epitaxially grown n-type layer 19 from the left side in FIG. 5 to form the p-type region 2 and the p-n junction. During this diffusion process, expansion of the high impurity n-type region 20 also takes place to achieve the geometry illustrated in FIG. 5. It will be seen that in this SCAT structure configuration the portion close to the gate electrode of the n-type region 19 adjacent the p-n junction has an increased impurity concentration and that occurrence of avalanche breakdown is limited to a region of the depletion layer close to the gate electrode in the same manner as in the embodiments previously described.

It is assumed in the foregoing description of all three embodiments that the p-n junction is formed by the diffusion-junction method. However, the junction can also be formed by the grown-junction, alloy-junction, or any other known method. It will also be appreciated that the equivalent performance can be obtained from a SCAT structure containing a p-n junction formed simply by interchanging the n-type region 3 and p-type region 2. Also, the well-known conventional semiconductor fabrication techniques are applicable to the formation of the insulating layer 5, gate electrode 6, source electrode 8, and drain electrode 9. Throughout the embodiments of this invention shown in FIGS. 3, 4, and 5, the gate electrode 6 may optionally be so formed on the top surface of the semiconductor crystal 1 as to cover the entire exposed end surface of the p-n junction in view of the improvement of the controllability of avalanche breakdown. Further, the width of the gate electrode 6 should be equal to or a little more than the width of the depletion layer in order to insure favorable performance of the SCAT device.

Figure 6B:
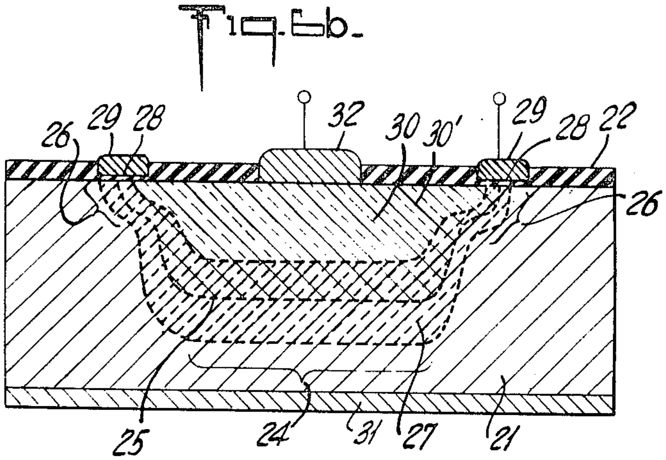
FIG. 6*b* is a cross-sectional view taken along the line A—A of FIG. 6*a*.

As noted, the embodiments shown in FIGS. 3 through 5 are merely schematic representations. FIGS. 6*a* and 6*b* represent a more detailed and more closely representative embodiment of the actual structure of this invention, and may be a silicon planar type SCAT device having a structure in which the impurity concentration gradient in the direction normal to the p-n junction has been varied along the junction plane in like manner as in FIG. 3.

Figure 6C:
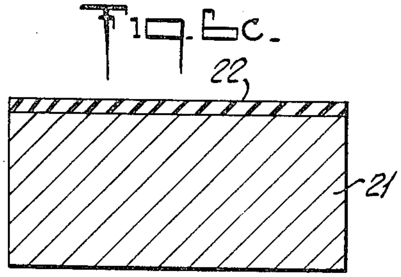
FIGS. 6*c*, 6*d* and 6*e* are cross-sectional views illustrating successive steps in the fabrication of the semiconductor device shown in FIGS. 6*a* and 6*b*.
Figure 6D:
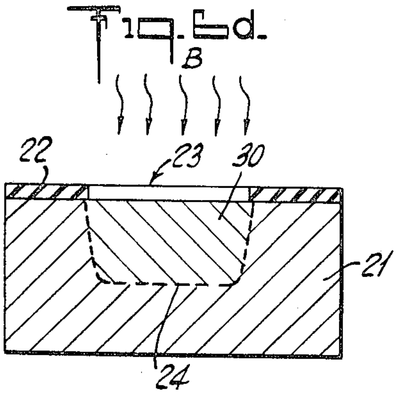
Figure 6E:
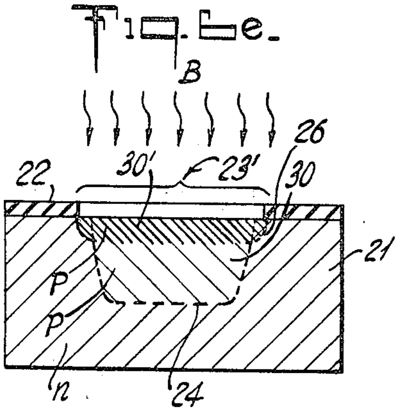

An outline of the fabrication method of the silicon planar type SCAT device of FIGS. 6*a* and 6*b* will be given in connection with three typical intermediate fabrication steps shown in FIGS. 6*c* through 6*e*. In the first step, a silicon dioxide film 22 is formed over the entire top surface of a high resistivity n-type silicon wafer 21, as illustrated in FIG. 6*c*. As shown in FIG. 6*d*, a central portion of the film 22 is then removed to provide a window 23 so that a part of the wafer 21 may be exposed. In the second step, a p-type impurity material such as boron of low surface concentration is diffused through the window 23 into the wafer 21 for a relatively long time interval. Thus, a p-type region 30 of low impurity concentration is formed in the wafer 21 to produce a p-n junction 24, with an extremely gentle impurity gradient being formed on each side thereof. In the third step, as shown in FIG. 6*e*, a portion of the oxide film 22 is removed to provide a window 23' which completely includes inside thereof the formerly opened window 23. Through the newly opened window 23', a p-type impurity material, boron for example, of high impurity concentration, is diffused into the wafer for a brief time interval. As a consequence, another p-type region 30' of high impurity concentration is formed in the shallow portion of the wafer and at the same time, a new p-n junction 26, comprising a minor p-n junction, is formed between the p-type region 30' and the n-type semiconductor wafer 21, the impurity concentration gradient at the minor p-n junction 26 on each side thereof being steeper than that on each side of the formerly formed major p-n junction 24.

When applying reverse bias across the p-n junctions 24 and 26, a depletion layer is formed at both the major junction 24 and the minor junction 26 for the same reverse bias voltage. The width of the depletion layer for the minor p-n junction 26 is narrower than that for the major p-n junction 24. Accordingly, the overall resulting p-n junction 25 and the depletion layer 27 will assume geometrical configurations generally as illustrated in FIG. 6*b* for a suitable bias voltage. Thus the intensity of an electric field produced in the depletion layer for the major p-n junction is relatively weak. Therefore, the performance of the p-n junction in this SCAT structure will not be degraded, if heterogeneous parts are present in or near the major p-n junction plane and occurrence of avalanche breakdown will take place exclusively at the minor p-n junction 26.

In the fourth step, a part of the silicon dioxide film 22, at and near the location in which the edge of the p-n junction 25 is exposed on the top wafer surface, is removed in circular form by the well known photo-resist technique. Subsequently, the wafer is subjected to a heating process in an oxidizing atmosphere so that a controlled thickness, thin silicon dioxide film 28 may be formed. On this film, aluminum is vacuum-evaporated to form a gate electrode 29. The electrodes 31 and 32 can be installed respectively on the back surface of the n-type region 21 and on the p-type region 30 by the well-known evaporation or alloying method. While electrode 31 is illustrated as installed on the back surface of the n-type region 21, a similar effect could be obtained if it is installed on the top surface of the n-type region 21, for instance, concentrically with the gate electrode 29.

It will be seen in the embodiment of FIG. 6 that the width of the depletion layer at the minor p-n junction portion 26 is uniformly narrowed along the entire circumference 26. This type of structural modification can be provided for any one of the previously described embodiments of this invention without substantially degrading the improved performance made possible by this invention.

With all of the above surface controlled avalanche transistor structures, the region or portion of the p-n junction which should be hardly influenced by the electric field produced from the external gate electrode, cannot initiate avalanche breakdown and is maintained in the cut-off state during operation of the SCAT device. In other words, the SCAT operates as if the wider p-n junction region (which does not participate substantially in the operation) had been eliminated from the structure. Therefore, the controllability of avalanche breakdown by the gate voltage, i.e., the amplification gain of the SCAT device, is markedly improved over the conventional SCAT structures.

Moreover, that the inner p-n junction region that is more remote from the top semiconductor surface has a relatively high avalanche breakdown voltage signifies that the width of the depletion layer in this region is larger than that close to the top semiconductor surface. This structural modification to the conventional SCAT device contributes greatly to a decrease in the source-drain capacity and to improvements in performance.

While the foregoing description sets forth the principles of the invention in connection with specific apparatus, it is to be understood that the description is made only by way of example and not as a limitation of the scope of the invention as set forth in the objects thereof and in the accompanying claims.

What is claimed is:

1. A semiconductor device comprising:

a single crystal semiconductor having a p-type conductivity region and an n-type conductivity region which forms a p-n junction comprising means for producing the phenomenon of avalanche breakdown, said p-n junction having at least a portion thereof exposed on the surface of said single crystal semiconductor, said surface-exposed portion of said p-n junction having a depletion layer width narrower than the depletion layer of the portions of said p-n junction which are more remotely located from said surface than said surface-exposed portion, an insulating layer overlying said surface-exposed portion of said p-n junction, and a metallic electrode formed on said insulating layer and overlying said narrower width depletion layer portion of said p-n junction, whereby substantially improved control of said avalanche breakdown phenomenon is achieved.

2. The invention described in claim 1 wherein said metallic electrode has an area at least as large as the exposed surface area of said narrower width depletion layer.

3. The invention described in claim 1 wherein at least one of said p- and n-type regions has an impurity concentration at said surface-exposed portion that is substantially greater than its impurity concentration at portions thereof which are more remotely located from said metallic electrodes.

4. The invention described in claim 1 wherein the impurity concentration gradient in said depletion layer is steepest at said surface-exposed portion of said p-n junction and becomes less steep at progressively greater distances of said p-n junction from said metallic electrode.

5. The invention described in claim 1 which further includes a second region of n-type conductivity having a higher impurity concentration than that of said first mentioned n-type region, and said second n-type region at least partly underlying said metallic electrode and forming a continuous region therewith.

References Cited

UNITED STATES PATENTS

| | | | |
|---|---|---|---|
| 3,206,670 | 9/1965 | Atalla | 317—235 X |
| 3,328,605 | 6/1967 | Abraham | 317—235 X |
| 3,341,380 | 9/1967 | Mets et al. | 317—235 X |

JAMES D. KALLAM, *Primary Examiner.*

U.S. Cl. X.R.

317—234